United States Patent
Hafezi et al.

(10) Patent No.: US 7,820,026 B2
(45) Date of Patent: Oct. 26, 2010

(54) METHOD TO DEPOSIT ORGANIC GRAFTED FILM ON BARRIER LAYER

(75) Inventors: Hooman Hafezi, Redwood City, CA (US); Aron Rosenfeld, Palo City, CA (US); Michael X. Yang, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 914 days.

(21) Appl. No.: 11/403,566

(22) Filed: Apr. 13, 2006

(65) Prior Publication Data

US 2006/0269658 A1 Nov. 30, 2006

Related U.S. Application Data

(60) Provisional application No. 60/671,252, filed on Apr. 13, 2005, provisional application No. 60/673,960, filed on Apr. 22, 2005.

(51) Int. Cl.
C25D 5/34 (2006.01)
(52) U.S. Cl. ........................... 205/205; 205/210
(58) Field of Classification Search .......... 205/157, 205/170, 205, 316, 317, 118, 210
See application file for complete search history.

(56) References Cited

U.S. PATENT DOCUMENTS

| | | | |
|---|---|---|---|
| 4,537,851 A * | 8/1985 | Nonogaki et al. ........... 430/144 |
| 5,567,297 A * | 10/1996 | Mertens et al. ............. 205/334 |
| 5,930,669 A | 7/1999 | Uzoh | |
| 6,130,156 A | 10/2000 | Havemann et al. | |
| 6,197,181 B1 * | 3/2001 | Chen .......................... 205/123 |
| 6,423,200 B1 * | 7/2002 | Hymes ........................ 205/123 |
| 6,432,821 B1 * | 8/2002 | Dubin et al. ................ 438/678 |
| 6,797,146 B2 * | 9/2004 | Morrissey et al. ........... 205/291 |
| 7,196,385 B2 | 3/2007 | Bureau et al. | |
| 7,247,226 B2 | 7/2007 | Bureau et al. | |
| 7,504,335 B2 * | 3/2009 | Yang et al. .................. 438/672 |
| 2002/0008036 A1* | 1/2002 | Wang ......................... 205/118 |
| 2002/0079232 A1* | 6/2002 | Shelnut ...................... 205/238 |
| 2004/0081900 A1* | 4/2004 | Bureau et al. ................. 430/31 |
| 2006/0141156 A1 | 6/2006 | Viel et al. | |

FOREIGN PATENT DOCUMENTS

| | | | |
|---|---|---|---|
| EP | 0250867 | * | 7/1988 |
| WO | 2004 018349 | | 3/2004 |
| WO | 2004 019385 | | 3/2004 |

* cited by examiner

*Primary Examiner*—Luan V Van
(74) *Attorney, Agent, or Firm*—Patterson & Sheridan, LLP

(57) ABSTRACT

Generally, the process includes depositing a barrier layer on a feature formed in a dielectric layer, decorating the barrier layer with a metal, performing a grafting process, initiating a copper layer and then filing the feature by use of a bulk copper fill process. Copper features formed according to aspects described herein have desirable adhesion properties to a barrier layer formed on a semiconductor substrate and demonstrate enhanced electromigration and stress migration results in the fabricated devices formed on the substrate.

18 Claims, 5 Drawing Sheets

METHOD TO DEPOSIT ORGANIC GRAFTED FILM ON BARRIER LAYER

CROSS-REFERENCE TO RELATED APPLICATIONS

This application claims benefit of U.S. Provisional Patent Application Ser. No. 60/671,252 filed Apr. 13, 2005 and U.S. Provisional Patent Application Ser. No. 60/673,960 filed Apr. 22, 2005, which are herein incorporated by reference.

BACKGROUND OF THE INVENTION

1. Field of the Invention

Embodiments of the invention generally relate to a method for barrier layer surface treatment to enable direct copper plating on barrier metal.

2. Description of the Related Art

Sub-quarter micron, multi-level metallization is one of the key technologies for the next generation of very large scale integration (VLSI) and ultra large scale integration (ULSI) semiconductor devices. The multilevel interconnects that lie at the heart of this technology require the filling of contacts, vias, lines, and other features formed in high aspect ratio apertures. Reliable formation of these features is very important to the success of both VLSI and ULSI as well as to the continued effort to increase circuit density and quality on individual substrates and die.

As circuit densities increase, the widths of contacts, vias, lines and other features, as well as the dielectric materials between them, are continually decreasing as the device feature sizes decrease from 65 nm to 32 nm and beyond. Many conventional deposition processes do not consistently fill structures with narrow openings or difficult aspect ratios. As such, there is a great amount of ongoing effort being directed at the void-free filling of nanometer-sized structures with narrow opening and/or high aspect ratios features wherein the ratio of feature height to feature width could be 4:1 or higher.

Additionally, as the feature widths decrease, the device current typically remains constant or increases, which results in an increased current density for such features. Elemental aluminum and aluminum alloys have been the traditional metals used to form vias and lines in semiconductor devices because aluminum has a low electrical resistivity, superior adhesion to most dielectric materials, and ease of patterning, and the aluminum in a highly pure form is readily available. However, aluminum has a higher electrical resistivity than other more conductive metals, such as copper (Cu). Aluminum can also suffer from electromigration, leading to the formation of voids in the conductor.

Copper and copper alloys have lower resistivities than aluminum, as well as a significantly higher electromigration resistance compared to aluminum. These characteristics are important for supporting the higher current densities experienced at high levels of integration and increased device speed. Copper also has good thermal conductivity. Therefore, copper is becoming a choice metal for filling sub-quarter micron, high aspect ratio interconnect features on semiconductor substrates.

Conventionally, deposition techniques such as chemical vapor deposition (CVD) and physical vapor deposition (PVD) have been used to fill these interconnect features. However, as the interconnect sizes decrease and aspect ratios increase, void-free interconnect feature fill by conventional metallization techniques becomes increasingly difficult using CVD and/or PVD. As a result thereof, plating techniques, such as electrochemical plating (ECP), have emerged as viable processes for filling sub-quarter micron sized high aspect ratio interconnect features in integrated circuit manufacturing processes.

Most ECP processes generally involve a two-stage process, wherein a seed layer is first formed over the surface of features on the substrate using a non-ECP type process, and then the surface of the features is exposed to an electrolyte solution while an electrical bias is simultaneously applied between the substrate surface and an anode positioned within the electrolyte solution.

Conventional plating practices include depositing a copper seed layer by physical vapor deposition (PVD), chemical vapor deposition (CVD), or atomic layer deposition (ALD) onto a diffusion barrier layer (e.g., tantalum or tantalum nitride). However, as the feature sizes become smaller, thickness of the seed layer must be reduced and thus it may become difficult to have adequate seed step coverage with PVD techniques, as discontinuous islands of copper or copper agglomerates are often obtained in the feature side walls close to the feature bottom. The thick copper layer on the field can cause the throat of the feature to close before the feature sidewalls are completely covered. When using CVD or ALD deposited barrier and/or seed layer films in place of a PVD deposited barrier and/or seed layer, typically adhesion problems arise due to the incorporation of organics from the precursor used in the CVD and ALD process in the deposited film. When the deposition thickness on the field is reduced to prevent throat closure, discontinuities are likely to appear in the seed layer. These discontinuities in the seed layer have been shown to directly cause voids, generate plating defects in the layers plated over the seed layer, and induce improper adhesion of the deposited layer to the oxidized barrier. In addition, copper tends to oxidize readily in the atmosphere and copper oxide readily dissolves in the plating solution. To prevent agglomeration or complete dissolution of copper in the features, the copper seed layer is usually made relatively thick (in mid hundreds angstroms), which can inhibit the plating process from filling the features.

Therefore, there is a need for a copper plating process that can fill features and does not require a copper seed layer.

SUMMARY OF THE INVENTION

The present invention provides methods for filling features on a substrate surface.

One embodiment of the present invention provides a method for filling a feature on a substrate surface. The method comprises depositing a discontinuous layer of a first metal on a barrier layer on the substrate surface, forming an organic layer on the substrate surface, and filling the feature on the substrate surface with a second metal.

Another embodiment of the present invention provides a method of filling a feature formed on a substrate surface. The Method comprises forming a barrier layer on the substrate surface, forming a discontinuous layer of metal on the substrate surface, grafting an organic layer on the substrate, initiating a copper layer on the substrate, and filling the feature on the substrate surface with copper.

Yet another embodiment of the present invention provides a method for depositing a copper layer on a substrate surface. The method comprises depositing a barrier layer on the substrate surface, decorating the barrier layer with a discontinuous metal film, grafting an organic layer on the substrate surface, and electroplating copper on the substrate surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1A:
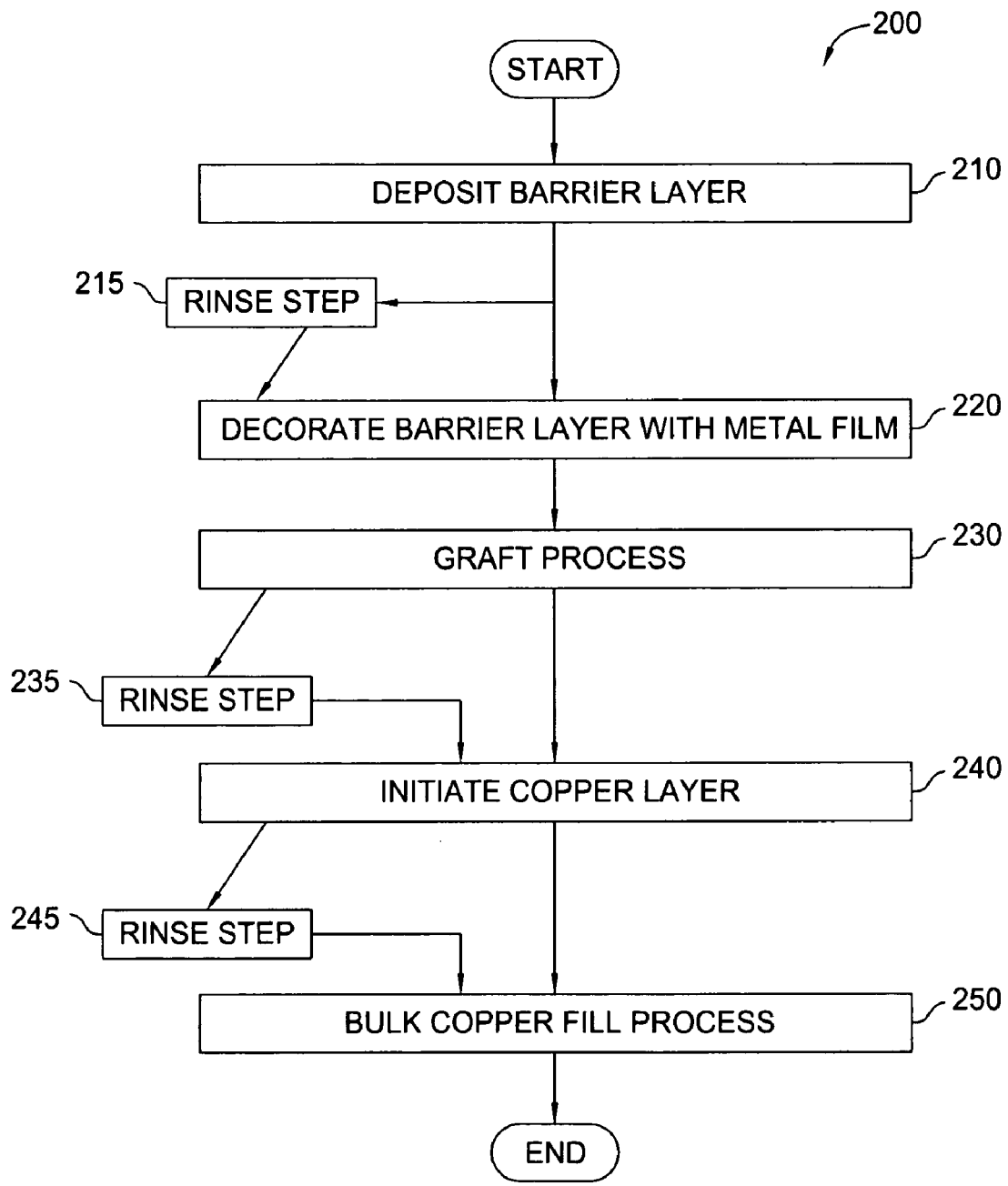
FIG. 1A is an illustration of process of performing one embodiment of the invention described herein.

FIG. 1A illustrates one embodiment of a process 200 that can be used to form a copper feature, such as interconnects. Generally, the process includes depositing a barrier layer on a feature formed in a dielectric layer, decorating the barrier layer with a metal, performing an electro-grafting process, initiating a copper layer and then filling the feature by use of a bulk copper fill process. Copper features formed according to aspects described herein have desirable adhesion properties to a barrier layer formed on a semiconductor substrate and demonstrate enhanced electromigration and stress migration results in the fabricated devices formed on the substrate.

Referring to FIG. 1A, the first process step 210, in the process 200 is to deposit a barrier on a substrate that contains features formed on the surface of a dielectric layer. The barrier layer typically includes a refractory metal nitride and/or silicide, such as nitrides or silicides of titanium (Ti), tungsten (W) or tantalum (Ta). Of this group, tantalum nitride is one of the most desirable materials for use as a barrier layer. Tantalum nitride (TaN) provides a good barrier to copper diffusion, even when relatively thin layers are formed (e.g., 20 Å or less). A tantalum nitride layer is typically deposited by conventional deposition techniques, such as physical vapor deposition (PVD), atomic layer deposition (ALD), and chemical vapor deposition (CVD). Typical barrier and liner layers used in integrated circuit interconnects and metallization layers include Ta/TaN, Ti/TiN, W/WN and Ti—W layers. However, for particular substrates that are relatively chemically inert and/or rapidly develop oxide films on exposure to air or aqueous environments, such as barrier and liner layers used in integrated circuit interconnections and metallizations, adhesion of directly plated copper films remains an issue. For example, when a Tantalum layer is deposited on the TaN or Tantalum layer to promote adhesion of the subsequent layers, the issue that arises is that Ta readily oxidizes which affects the ability of the subsequent layers to bond to the barrier layer(s).

In one aspect of the invention, a rinse step 215 may be added to the process sequence to remove any unwanted materials that may reside on the substrate surface from the prior process and remove any oxides formed on the barrier layer prior to forming the discontinuous layer described below. A typical rinse solution may include deionized water, or deionized water containing hydrofluoric acid (HF) or other fluorine containing acids. A typical rinse process may include spraying the surface of the substrate with the rinse solution while the substrate is being rotated. This step is particularly useful where the process step 220 is performed using an electroplating, electroless plating process or PVD.

Process step 220 is used to deposit some metal on to the barrier layer to allow the subsequent processes to occur thereon. In this step, generally a discontinuous layer can be deposited on the surface of the barrier layer deposited in the process step 210. In one aspect, a semi-continuous metal layer may be used in place of a discontinuous metal layer. In general, the discontinuous layer can be deposited on the barrier layer right after the barrier deposition process, such as in a cluster tool (e.g., an ENDURA system from Applied Materials, Inc.) by use of a PVD, CVD, or ALD process to form the metal layer. The discontinuous layer may be generally described as clusters or islands of metal distributed on the barrier layer surface. In another aspect, the discontinuous layer can be deposited on the barrier layer by use of an electroplating process or an electroless deposition process. In one aspect, the discontinuous layer may be a layer that is less than 30 Angstroms thick, or more preferably less than 10 Angstroms thick, or so that it is discontinuous. Typical metals that are useful for forming the discontinuous layer are tin (Sn), chromium (Cr), titanium (Ti), aluminum (Al), silver (Ag), palladium (Pd), vanadium (V), ruthenium (Ru), rhodium (Rh), cobalt (Co) cadmium (Cd), nickel (Ni), lead (Pb), iron (Fe), or combinations thereof. Preferably, the discontinuous layer is formed using aluminum (Al), tin (Sn), chromium (Cr), titanium (Ti), vanadium (V) or iron (Fe). In one aspect, the discontinuous metal layer is copper (Cu) or a copper alloy.

The discontinuous layer can be, or is believed to be, useful for electro-grafting (discussed below), since the electrocatalytic properties of certain metal electrodes may be enhanced by "decorating" their surfaces (e.g., depositing a discontinuous layer) with submonolayer amounts of particular second metals. In general, this is attributed to modification of the structural and/or electronic properties of the electrode surface by the second metal adatoms. The surface coverage of adatoms can, in some cases, be considerably less than a monolyer—even only a few percent of a monolayer (defined as= $[N_A d^2]^{-1}$ where d is diameter of an adatom and $N_A$ is Avogadro number)—and yet provide an order of magnitude enhancement in catalytic activity for certain electrode reactions. In such cases, the adatom induced catalytic activity is most likely electronic in nature rather than structural or geometric. The changes in surface electronic structure are spatially delocalized so that the entire surface is catalytically activated. Such delocalized electronic effects can produce large amplification of electrode currents even with minimal surface coverage by the adatoms. One delocalized effect of metal adatoms can be modification of the substrate work function whereby the adatom perturbs the surface electron density of the substrate metal. The entire electrode surface can be affected by the delocalized electronic interactions even when a small fraction of the surface is covered with adatoms. Work function, or ability to give up electrons, is key to enabling the grafting reaction (process step 230 described below). In the method proposed here, a non-reactive surface is decorated with specific second metal adatoms that increase charge transfer at the surface and that may additionally promote or catalyze the reduction of specific grafting compounds to form surface grafted organic layers (process step 230 described below).

In process step 230, the grafting process, such as electrografting and/or chemical grafting, can be performed on the metal-decorated substrate to form an adhesion layer which helps to bond the subsequent plated layers. The process of grafting generally includes exposing a surface of the substrate to an organic molecule that goes through a reduction process due to the interaction with the surface of the substrate and forms a strong bond with the exposed surface. It is believed that strong bonds between the grafted layer and the substrate and between the grafted layer and the plated film help promote the adhesion of the subsequent layers to the grafted layer and the layers below. Typical organic grafting molecules include diazonium salts (e.g., various benzenediazonium tetrafluoroborate salts) and vinyl-monomers (e.g., acrylonitrile, methacrylonitrile, vinylpyridine, methyl methacrylate, or other electron deficient alkenes). In one aspect, the organic molecule bonds with both the oxidized barrier layer and the discontinuous layer formed in process step 220.

Process step 230 may be performed in two main ways. In the first method, or chemical grafting method, the surface of the substrate that contains the barrier layer and the discontinuous layer that is exposed to a solution containing a concentration of the grafting molecule, (e.g., diazonium salt or vinyl-monomer) during a spin-on type deposition process. A spin-rinse and dry chamber (SRD) useful to perform this chemical grafting process can be purchased from Applied Materials Inc., of Santa Clara, Calif. In this process, a desired amount of the solution is deposited on the surface of the substrate as the substrate is being rotated to assure coverage and uniformity of the deposited layer. During the process, the organic molecules are spread across the surface of the substrate and react to form a bond to the exposed surfaces.

A second method of performing process step 230 includes inserting the substrate into a plating cell, such as a Slim-Cell available from Applied Materials, and performing an electrodeposition process on the substrate. The electrodeposition process is completed by making electrical contact with the surface of the substrate, which contains the barrier and the discontinuous layer, immersing the substrate in a grafting process solution containing a concentration of the grafting organic molecule and cathodically biasing the substrate surface using a power supply relative to an electrode submersed in, or in electrical communication with, the grafting process solution. After biasing the substrate for a desired period of time, the process is stopped. In one aspect of the process, the flow rate of the grafting process solution, the pH of the grafting process solution, the concentration of the grafting organic molecules in the grafting process solution, the temperature of the grafting process solution, and the waveform delivered to the substrate is controlled to optimize the grafting process.

In process step 240, an initial copper deposition step is performed. In one aspect, of the invention where the grafting process is performed electrolytically, the initial copper deposition performed in step 240 is combined with step 230 and performed by immersing the substrate in the same bath as the electrografting step with a concentration of Cu, and then biasing the substrate surface at one potential to start the grafting process in process step 230 and then biasing the substrate at a another potential (e.g., higher potential) to initiate the copper growth on the grafted layer to perform step 240.

In another embodiment of process step 240, where the grafting process is not performed electrolytically (e.g., chemical grafting) or the electrografting processing solution is not desirable to perform the initial copper deposition step, process step 240 may be performed by immersing the substrate in a separate processing solution that contains copper ions, after the grafting process has been performed, and then biasing the substrate at a cathodic potential to initiate the copper growth on the grafted layer.

In process step 250, a copper bulk-fill deposition step is performed on the substrate. In one aspect, the bulk fill process is performed in another process chamber using a different chemistry than the one used in process step 230 and process step 240. The bulk fill process will generally use conventional copper electroplating solutions containing accelerators, suppressors and levelors as required to complete the bulk fill process step. In another aspect, step 240 and 250 are combined when step 240 is carried out separately from step 230.

One or more rinse steps, such as process step 235 and process step 245, may be added to the process sequence to remove any unwanted materials that may reside on the substrate surface from the prior process steps. A typical rinse solution may include deionized water, or deionized water containing a low concentration of an acid or base material. A typical rinse process may include spraying the surface of the substrate with the rinse solution while the substrate is being rotated.

Figure 1B:
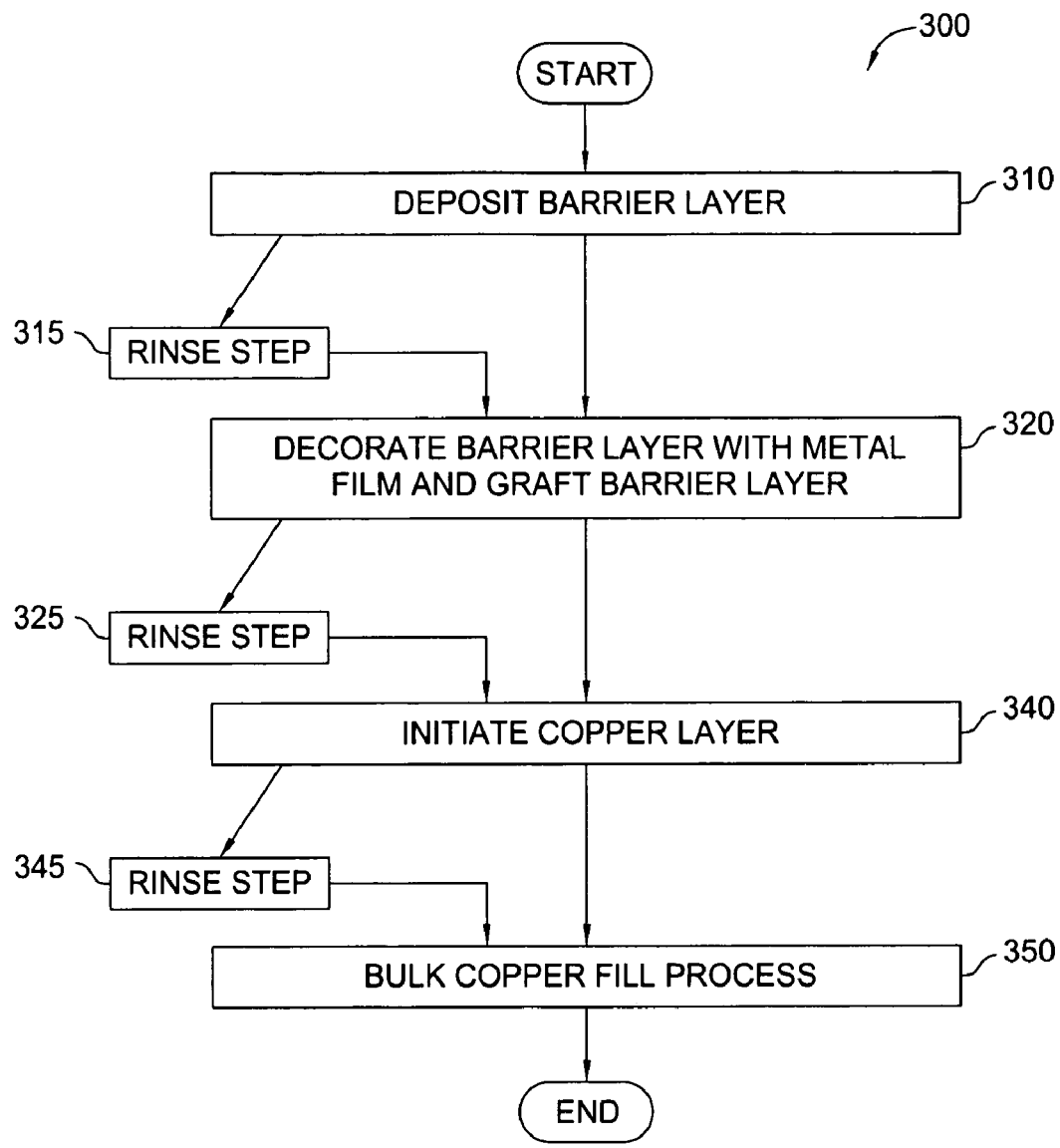
FIG. 1B is an illustration of another embodiment of the invention described herein.

In another embodiment illustrated by FIG. 1B, the processes of decorating a barrier layer with metal film and grafting the barrier layer are performed in a single process step 320. In one aspect, both decorating and grafting the barrier layer can be performed by using an electrodeposition process. A method of performing process step 320 includes inserting the substrate into a plating cell, such as a Slim-Cell available from Applied Materials, and performing an electrodeposition process on the substrate. The electrodeposition process is completed by making electrical contact with the surface of the substrate which contains the barrier layer, immersing the substrate in a solution containing an amount of metal, which is intended to decorate the barrier layer, and a concentration of the grafting organic molecule, and then cathodically biasing the substrate surface using a power supply relative to an electrode submersed in, or in electrical communication with, the solution. After biasing the substrate for a desired period of time, the process is stopped. In one aspect, one electrical bias level can be applied to facilitate deposition of the decorating metal and a different electrical bias level can be applied to facilitate the electro-grafting process. In another aspect of the invention, where a chemical grafting process can be performed after the decoration layer is formed, the electrical bias can be stopped once the decoration layer is formed and then the organic molecules in the solution can then be left in contact with the substrate for a desired period of time to allow them to react with and form strong bonds with the decoration layer and the exposed substrate surface.

Figure 1C:
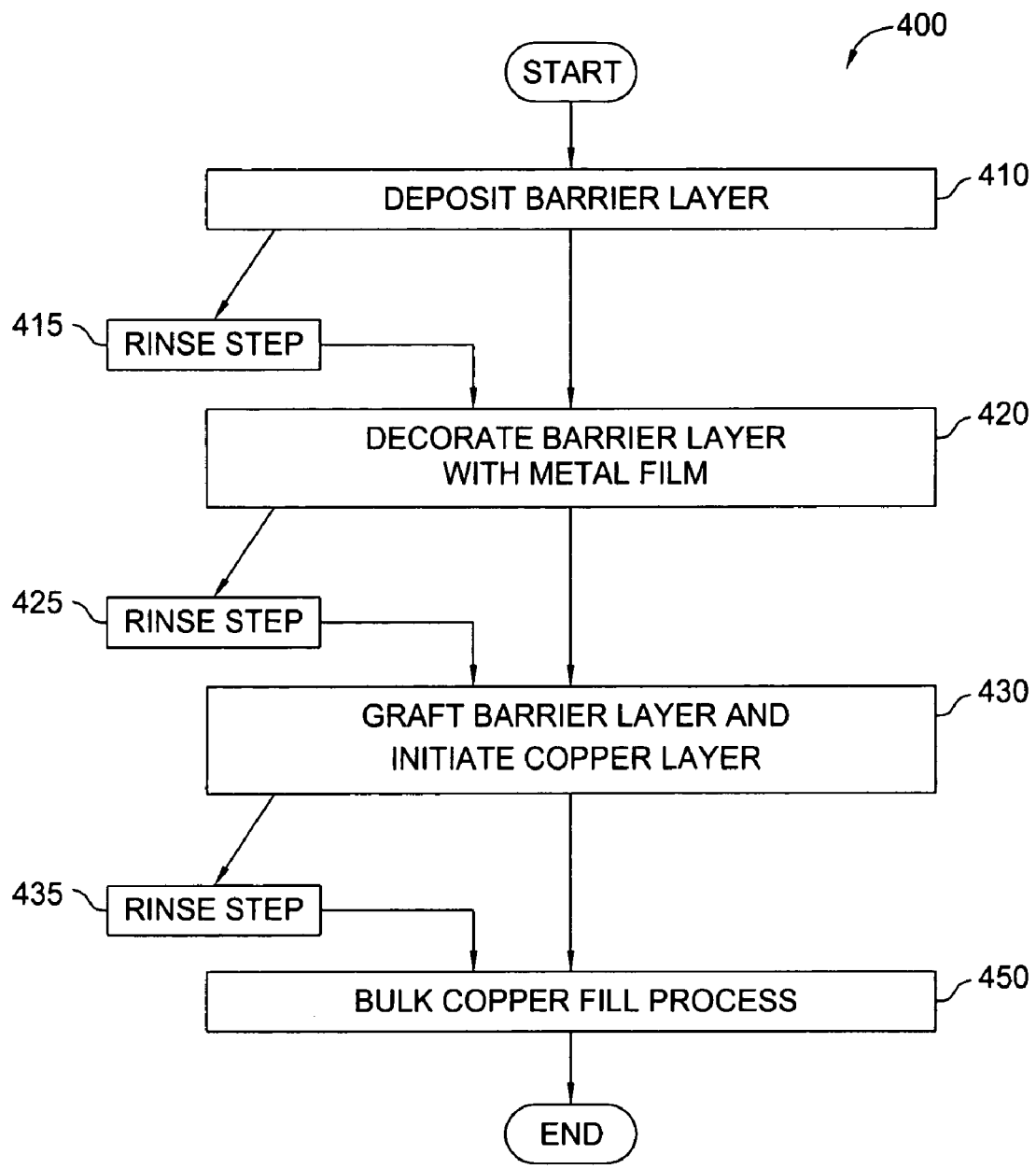
FIG. 1C is an illustration of another embodiment of the invention described herein.

FIG. 1C illustrates a process sequence 400 that may be used to form a copper feature, such as an interconnect. Process 400 is similar to the processes described in FIG. 1, except that the process steps 230 and 240 have been combined into a single process step (e.g., item # 430). In process step 430, the grafting process and initial copper plating process steps are performed in one process step using an appropriate bath to generate a continuous, conformal layer. In one aspect, step 430 may be performed by immersing a substrate having a barrier layer and decoration layer in a grafting process solution to form an adhesion layer, then cathodically biasing the substrate while it is immersed in the grafting process solution to initiate the growth of copper onto the grafted layer and possibly the decoration layer. In another aspect of the invention, where the grafting process is performed electrolytically, process step 430 may be performed by immersing the substrate in a grafting process solution and then cathodically biasing the substrate at one potential to start the electrografting process and then cathodically biasing the substrate at another potential (e.g., higher potential) to initiate the copper growth on the grafted layer and possibly the decoration layer.

Figure 1D:
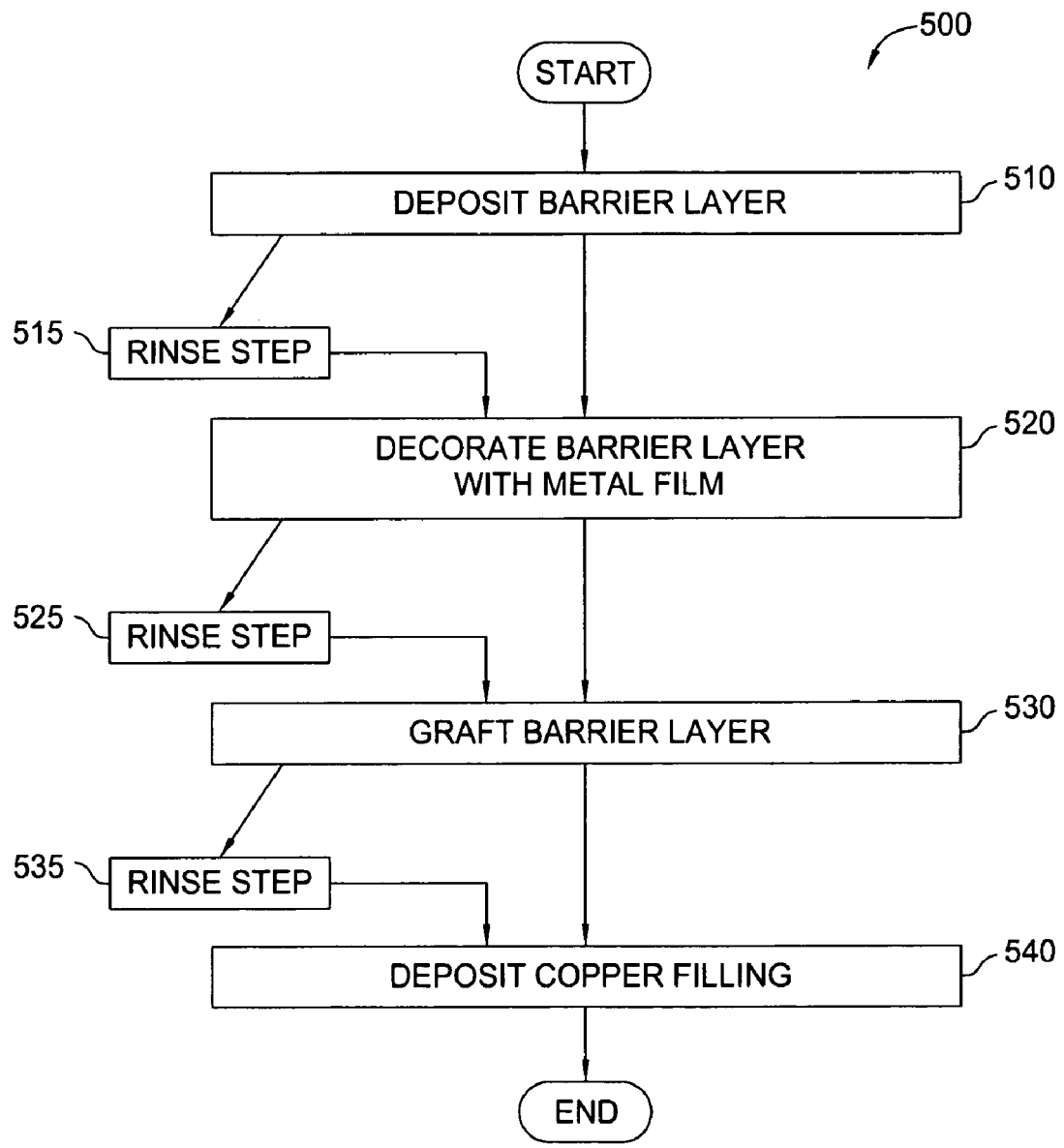
FIG. 1D is an illustration of another embodiment of the invention described herein.
Figure 2A:
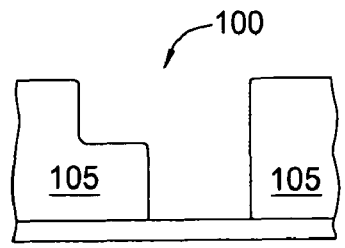
FIGS. 2A-F illustrate schematic cross-sectional view of an integrated circuit fabrication sequence formed by a process described herein.
Figure 2B:
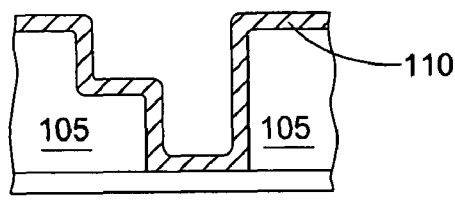
Figure 2C:
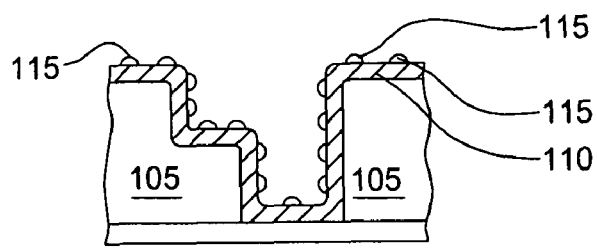
Figure 2D:
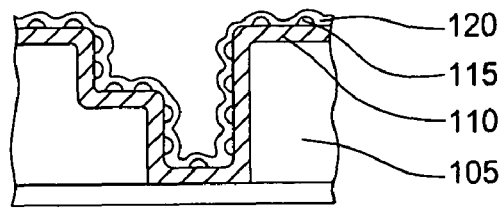
Figure 2E:
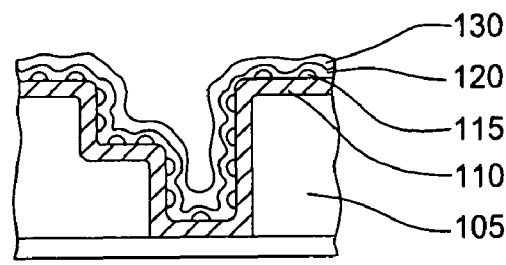
Figure 2F:
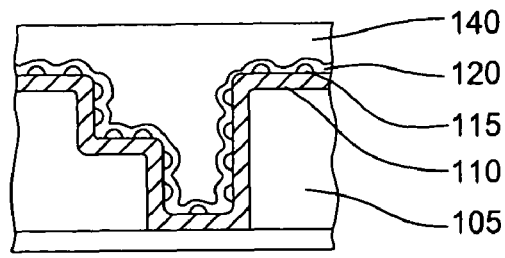

FIG. 1D illustrates yet another embodiment of present invention, where initiate copper layer step on the grafted layer and copper bulk filling step are performed in one process step 540. One will note that process 500 is similar to the processes described in FIG. 1, except that the process steps 240 and 250 have been combined into a single process step (e.g., item # 540). In one aspect, the two stage copper deposition process can be performed in the same electroplating chamber and use the same process chemistry. In another aspect, the process parameters, such as the current density of cathodic bias, can be adjusted to different values before, during or after the initial copper layer is formed to improve the film properties.

While the foregoing is directed to embodiments of the present invention, other and further embodiments of the invention may be devised without departing from the basic scope thereof, and the scope thereof is determined by the claims that follow.

What is claimed:

1. A method for filling a feature on a substrate surface, comprising:
    depositing a discontinuous layer of a first metal on a barrier layer on the substrate surface;
    forming an organic layer on the substrate surface by a grafting process that exposes the substrate surface to a bath containing grafting organic molecules and a second metal, wherein the grafting organic molecules comprise one of diazonium salts or vinyl-monomers; and
    filling the feature on the substrate surface with the second metal by depositing a layer of the second metal over the organic layer, wherein the depositing a layer of the second metal comprises initiating growth of the second metal over the organic layer by biasing the substrate in the bath containing the grafting organic molecules and the second metal at a first potential.

2. The method of claim 1, wherein the grafting process is electro-grafting performed by immersing the substrate in the bath containing the grafting organic molecules and the second metal and biasing the substrate at a second potential, and second potential is lower than the first potential.

3. The method of claim 1, wherein the grafting process is chemical grafting.

4. A method of filling a feature formed on a substrate surface, comprising:
    forming a barrier layer on the substrate surface;
    forming a discontinuous layer of metal on the substrate surface;
    grafting an organic layer on the substrate by immersing the substrate in a grafting solution containing grafting organic molecules and copper ions, wherein the organic layer bonds with both the barrier layer and the discontinuous layer of metal, and the grafting organic molecules comprise one of diazonium salts or vinyl-monomers;
    initiating a copper layer over the organic layer on the substrate by biasing the substrate cathodically in the grafting solution; and
    filling the feature on the substrate surface with copper.

5. The method of claim 4, wherein grafting the organic layer and initiating the copper layer are performed continuously in the same grafting solution a single process step.

6. The method of claim 5, wherein grafting the organic layer and initiating the copper layer are performed by immersing the substrate in the grafting solution while biasing the substrate cathodically at a first potential and a second potential respectively, and the second potential is higher than the first potential.

7. The method of claim 4, further comprising rinsing the substrate forming the barrier layer, forming the discontinuous layer, and grafting the organic layer, initiating the copper layer and filling the feature.

8. A method for depositing a copper layer on a substrate surface, comprising:
    depositing a barrier layer on the substrate surface;
    decorating the barrier layer with a discontinuous metal film comprising:
        making electrical contact with the barrier layer; and
        immersing the substrate in a solution containing a metal and grafting
    organic molecules while biasing the substrate at a first potential;
    grafting an organic layer on the substrate surface by immersing the substrate in the solution containing the metal and grafting organic molecules, wherein the organic layer bonds with both the barrier layer and the discontinuous metal film, and the grafting organic molecules comprise one of diazonium salts or vinyl-monomers; and
    forming copper layer over the organic layer by electroplating copper on the substrate surface.

9. The method of claim 8, wherein the discontinuous metal film comprises one of aluminum, tin, chromium, titanium, vanadium, iron, or copper.

10. The method of claim 8, further comprising rinsing the substrate after the depositing the barrier layer, and grafting the organic layer.

11. The method of claim 1, wherein the grafting organic molecules comprise benzenediazonium tetrafluoroborate salt.

12. The method of claim 1, wherein the grafting organic molecules comprise electron deficient alkenes.

13. The method of claim 8, wherein the grafting organic molecules comprise benzenediazonium tetrafluoroborate salt.

14. The method of claim 8, wherein the grafting organic molecules comprise an electron deficient alkene.

15. The method of claim 1, wherein the layer of the second metal is adhesive to the organic layer.

16. The method of claim 12, wherein the electron deficient alkene is acrylonitrile, methacrylonitrile, or vinylpyridine.

17. The method of claim 14, wherein the electron deficient alkene is acrylonitrile, methacrylonitrile, or vinylpyridine.

18. The method of claim 4, wherein the grafting organic molecules comprises acrylonitrile, methacrylonitrile, or vinylpyridine.

* * * * *